US010700184B2

(12) United States Patent
Tamaki et al.

(10) Patent No.: US 10,700,184 B2
(45) Date of Patent: Jun. 30, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Tomohiro Tamaki, Nonoichi (JP); Kazutoshi Nakamura, Nonoichi (JP); Ryohei Gejo, Kanazawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/120,771

(22) Filed: Sep. 4, 2018

(65) Prior Publication Data

US 2019/0296132 A1 Sep. 26, 2019

(30) Foreign Application Priority Data

Mar. 20, 2018 (JP) ................................ 2018-053338

(51) Int. Cl.
*H01L 29/739* (2006.01)
*H01L 23/535* (2006.01)
*H01L 27/06* (2006.01)

(52) U.S. Cl.
CPC ........ *H01L 29/7397* (2013.01); *H01L 23/535* (2013.01); *H01L 27/0664* (2013.01)

(58) Field of Classification Search
CPC .................................................. H01L 29/7397
See application file for complete search history.

(56) References Cited

U.S. PATENT DOCUMENTS 5,360,984 A * 11/1994 Kirihata .............. H01L 27/0617 257/139
6,188,109 B1 * 2/2001 Takahashi ............... H01L 22/34 257/153

(Continued)

FOREIGN PATENT DOCUMENTS

JP 2009-267394 11/2009
JP 2013-138069 7/2013

(Continued)

OTHER PUBLICATIONS

Fumihito Masuoka, et al., "RFC diode with High Avalanche Stability and UIS Capability," Proceedings of the 29$^{th}$ International Symposium on Power Semiconductor Devices & ICs, Sapporo, 2017, pp. 131-134.

*Primary Examiner* — William A Harriston
(74) *Attorney, Agent, or Firm* — Oblon, McClelland, Maier & Neustadt, L.L.P.

(57) ABSTRACT

According to one embodiment, a semiconductor device a first electrode, a first semiconductor region, a second semiconductor region, a third semiconductor region, a fourth semiconductor region, a fifth semiconductor region, a sixth semiconductor region, a seventh semiconductor region, an eighth semiconductor region, a gate electrode, a ninth semiconductor region, and a second electrode. The first, second, and fourth semiconductor regions are provided on the first electrode. The third semiconductor region is provided between the first and second semiconductor regions. The fifth semiconductor region is provided on the first, second, third, and fourth semiconductor regions. The sixth and seventh semiconductor regions are provided on the fifth semiconductor region. The eighth semiconductor region is provided on a portion of the seventh semiconductor region. The ninth semiconductor region is provided around the sixth semiconductor region and the seventh semiconductor (Continued)

region. The ninth semiconductor region is positioned on the second semiconductor region.

8 Claims, 12 Drawing Sheets

(56) References Cited

U.S. PATENT DOCUMENTS 8,847,276 B2* 9/2014 Tanabe ............. H01L 29/66348 257/139
9,219,060 B2* 12/2015 Ogura ................. H01L 29/7397
10,121,866 B2* 11/2018 Naito ..................... G01K 13/00
10,439,038 B2* 10/2019 Oota ................. H01L 29/66348
2002/0167047 A1* 11/2002 Yasuhara ............ H01L 29/1045 257/341
2009/0242931 A1* 10/2009 Tsuzuki ................ H01L 29/167 257/143
2009/0283799 A1* 11/2009 Ruething ............ H01L 29/0834 257/143
2012/0181575 A1* 7/2012 Pfirsch ................ H01L 29/1095 257/139
2013/0181328 A1* 7/2013 Cao ..................... H01L 29/0634 257/618
2015/0179636 A1* 6/2015 Pfirsch ................ H01L 29/7397 257/140
2015/0255629 A1* 9/2015 Gejo ................... H01L 27/0664 257/139
2016/0218101 A1* 7/2016 Gejo ................... H01L 29/7397
2017/0110449 A1* 4/2017 Gejo ................... H01L 27/0664
2017/0263603 A1 9/2017 Hata et al.
2018/0226399 A1 8/2018 Tamaki et al.
2019/0259747 A1* 8/2019 Gejo ................... H01L 29/0615
2020/0058779 A1* 2/2020 Gejo ................... H01L 29/7397

FOREIGN PATENT DOCUMENTS

JP 2016-072359 5/2016
JP 2018-129448 8/2018

* cited by examiner

SEMICONDUCTOR DEVICE

CROSS-REFERENCE TO RELATED APPLICATIONS

This application is based upon and claims the benefit of priority from Japanese Patent Application No. 2018-053338, filed on Mar. 20, 2018; the entire contents of which are incorporated herein by reference.

FIELD

Embodiments described herein relate generally to a semiconductor device.

BACKGROUND

A RC-IGBT (Reverse Conducting Insulated Gate Bipolar Transistor) in which a FWD (Free Wheeling Diode) is built into an IGBT (Insulated Gate Bipolar Transistor) is a semiconductor device used in power conversion, etc. It is desirable for breakdown not to occur easily in the operations of the semiconductor device.

DETAILED DESCRIPTION

Figure 1:
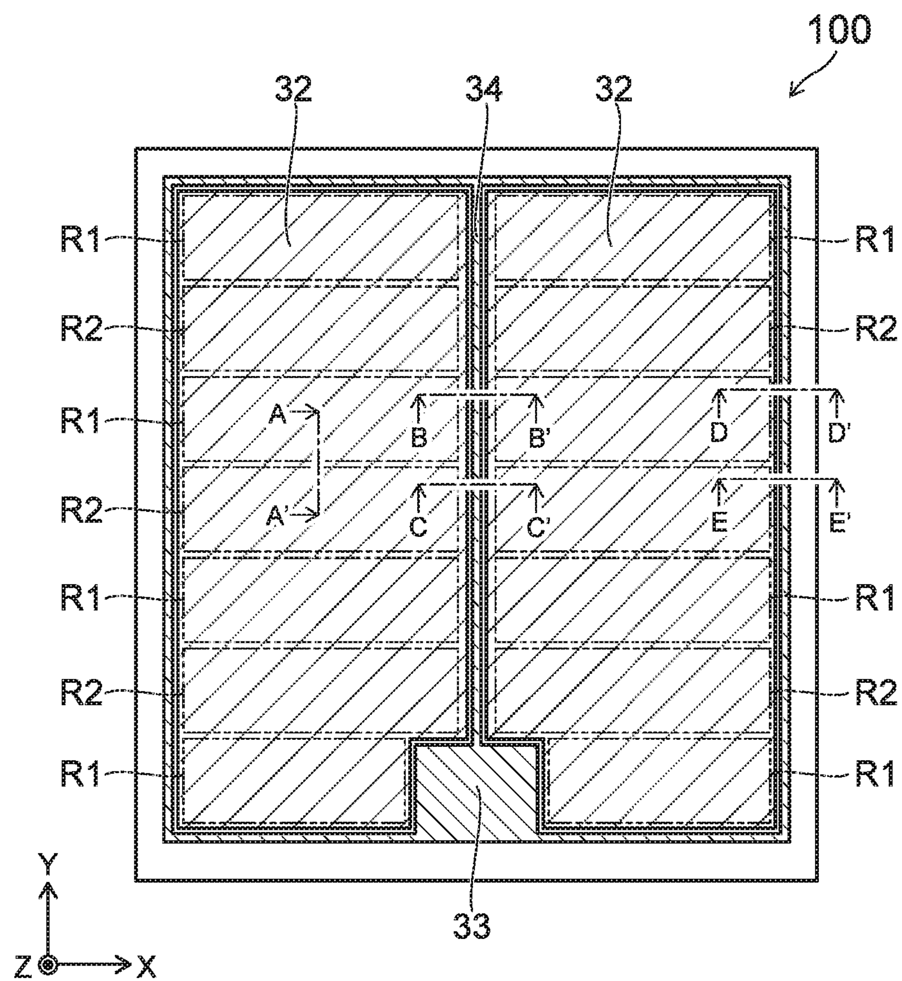
FIG. 1 is a plan view of a semiconductor device according to an embodiment.

According to one embodiment, a semiconductor device a first electrode, a first semiconductor region, a second semiconductor region, a third semiconductor region, a fourth semiconductor region, a fifth semiconductor region, a sixth semiconductor region, a seventh semiconductor region, an eighth semiconductor region, a gate electrode, a ninth semiconductor region, and a second electrode. The first semiconductor region is provided on the first electrode. The first semiconductor region is of a first conductivity type. The second semiconductor region is provided on the first electrode. The second semiconductor region is separated from the first semiconductor region in a first direction. The third semiconductor region is provided between the first semiconductor region and the second semiconductor region. The third semiconductor region is of a second conductivity type. An impurity concentration of the second conductivity type in the third semiconductor region is higher than an impurity concentration of the second conductivity type in the second semiconductor region. The fourth semiconductor region is provided on the first electrode. The fourth semiconductor region is of the second conductivity type. The fourth semiconductor region is arranged with the first semiconductor region and the third semiconductor region in a second direction perpendicular to the first direction. The fifth semiconductor region is provided on the first semiconductor region, the second semiconductor region, the third semiconductor region, and the fourth semiconductor region. The fifth semiconductor region is of the first conductivity type. The sixth semiconductor region is provided on the fifth semiconductor region. The sixth semiconductor region is positioned on the first semiconductor region. The sixth semiconductor region is of the second conductivity type. The seventh semiconductor region is provided on the fifth semiconductor region. The seventh semiconductor region is positioned on the fourth semiconductor region. The seventh semiconductor region is of the second conductivity type. The eighth semiconductor region is provided on a portion of the seventh semiconductor region. The eighth semiconductor region is of the first conductivity type. The gate electrode opposes, with a gate insulating layer interposed, the seventh semiconductor region, a portion of the fifth semiconductor region, and at least a portion of the eighth semiconductor region. The ninth semiconductor region is provided around the sixth semiconductor region and the seventh semiconductor region. The ninth semiconductor region is positioned on the second semiconductor region. The ninth semiconductor region is of the second conductivity type. An impurity concentration of the second conductivity type in the ninth semiconductor region is higher than impurity concentrations of the second conductivity type in the sixth semiconductor region and the seventh semiconductor region. The second electrode is provided on the sixth semiconductor region, the seventh semiconductor region, and the eighth semiconductor region. The second electrode is electrically connected to the sixth semiconductor region, the seventh semiconductor region, the eighth semiconductor region, and the ninth semiconductor region.

In the drawings and the specification of the application, components similar to those described thereinabove are marked with like reference numerals, and a detailed description is omitted as appropriate.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

Embodiments of the invention will now be described with reference to the drawings.

In the drawings and the description recited below, the notations of $n^+$, n, $n^-$, $p^+$, p, and $p^-$ indicate relative levels of the impurity concentrations of the conductivity types. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate the relative level of the net impurity concentration after the impurities are compensated.

In the embodiments described below, the embodiments may be carried out by reversing the p-type and the n-type of each semiconductor region.

FIG. 1 is a plan view of a semiconductor device according to an embodiment.

Figure 2:
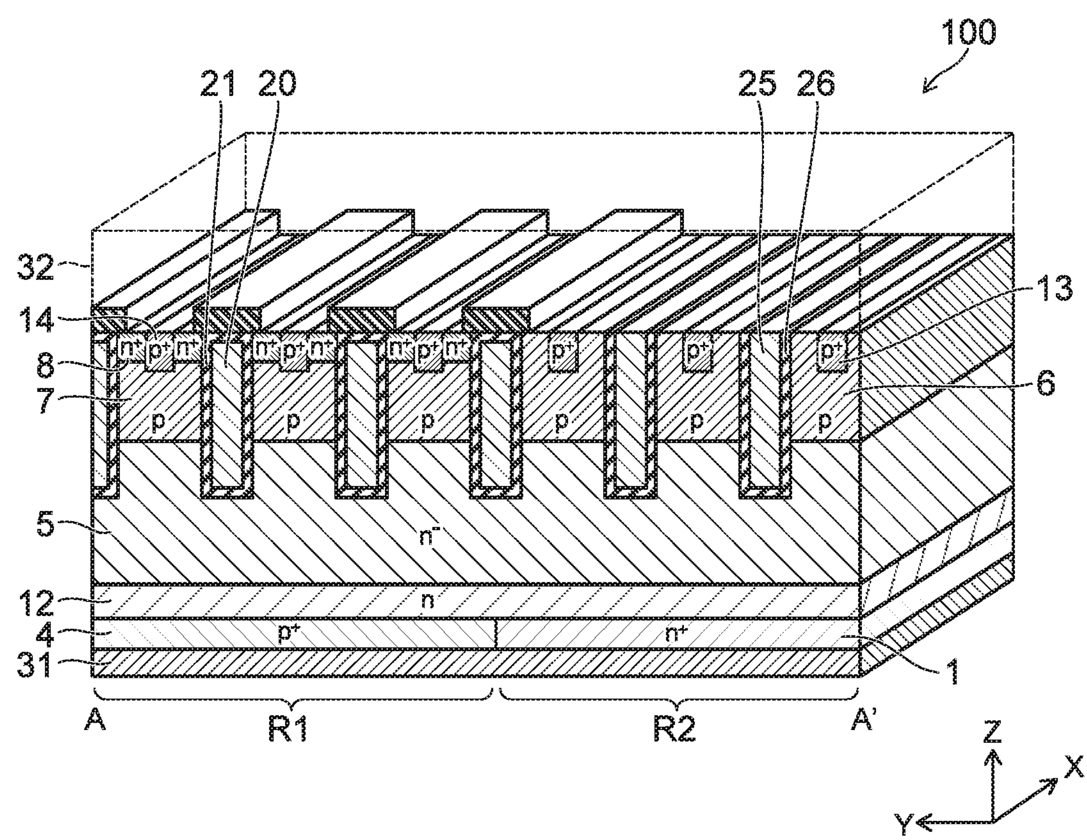
FIG. 2 is a perspective cross-sectional view including an A-A' cross section of FIG. 1.

FIG. 2 is a perspective cross-sectional view including an A-A' cross section of FIG. 1.

Figure 3A:
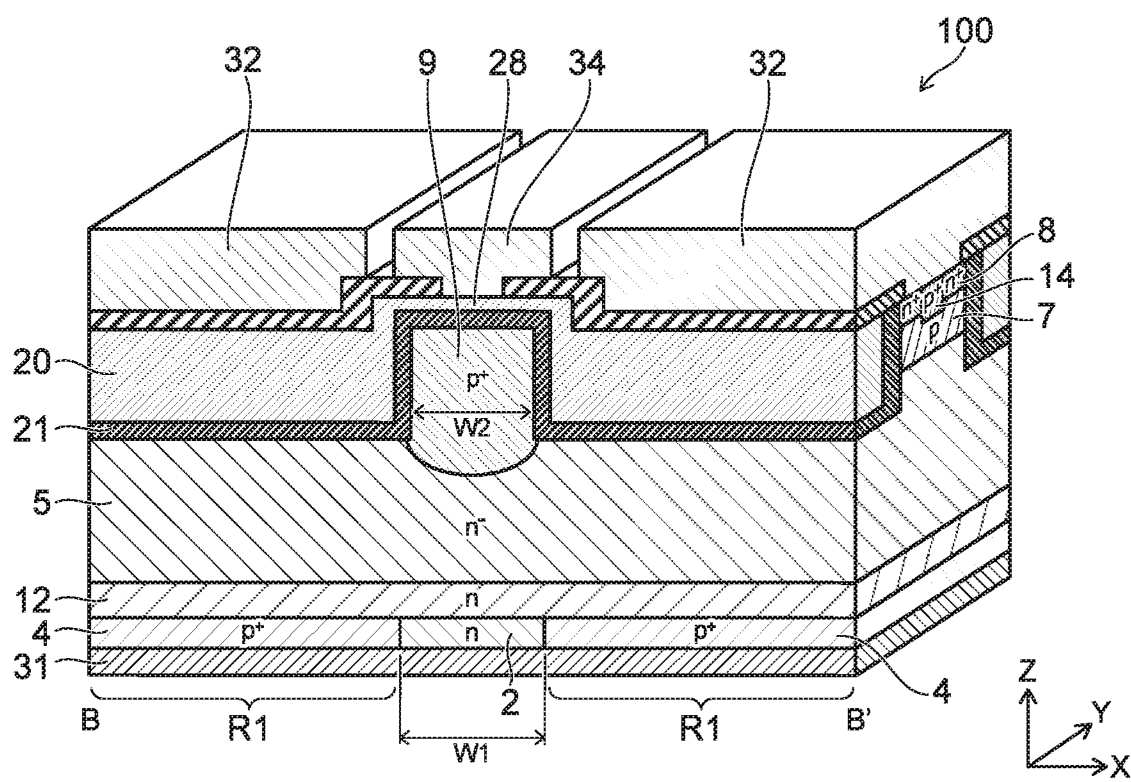
FIGS. 3A and 3B are a perspective cross-sectional view including a B-B' cross section of FIG. 1 and a perspective cross-sectional view including a C-C' cross section of FIG. 1.
Figure 3B:
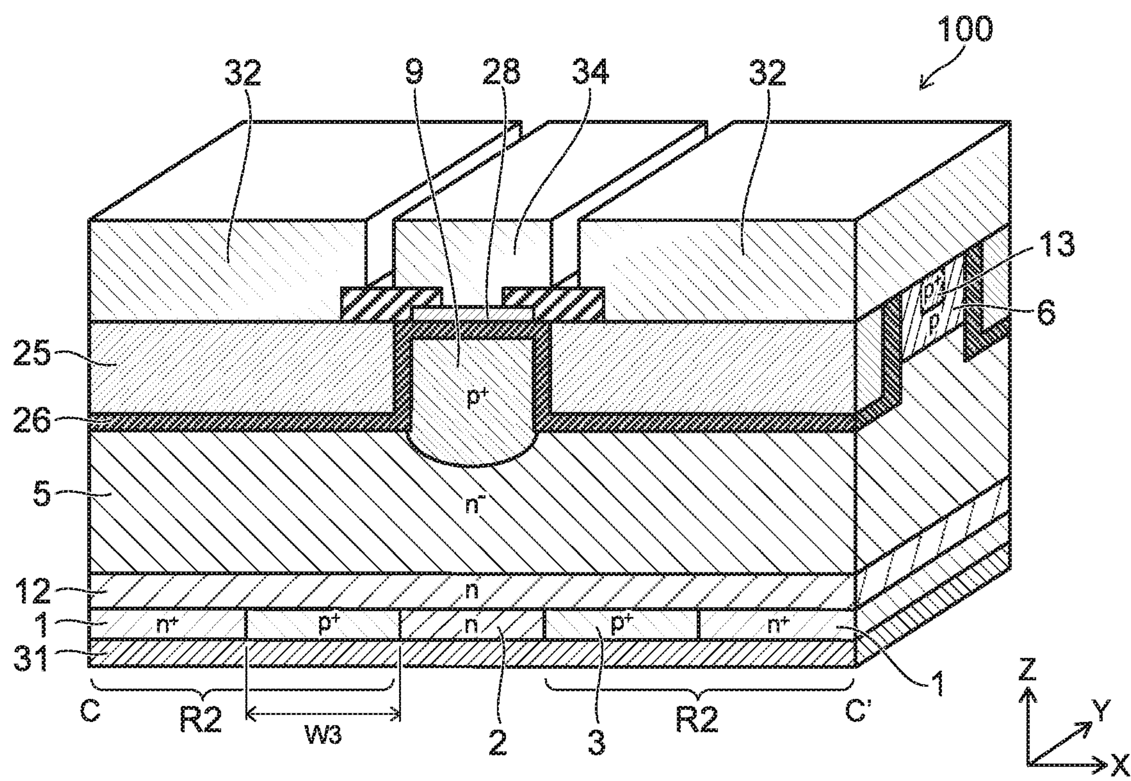

FIGS. 3A and 3B are a perspective cross-sectional view including a B-B' cross section of FIG. 1 and a perspective cross-sectional view including a C-C' cross section of FIG. 1.

Figure 4A:
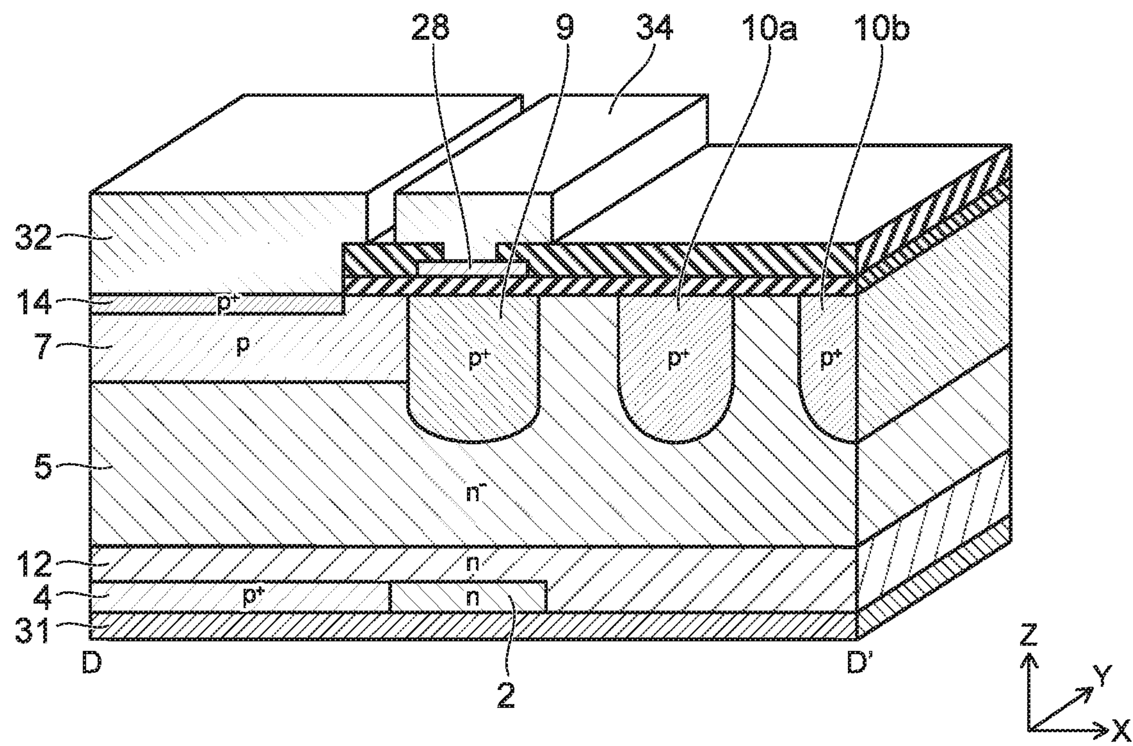
FIGS. 4A and 4B are a perspective cross-sectional view including a D-D' cross section of FIG. 1 and a perspective cross-sectional view including an E-E' cross section of FIG. 1.
Figure 4B:
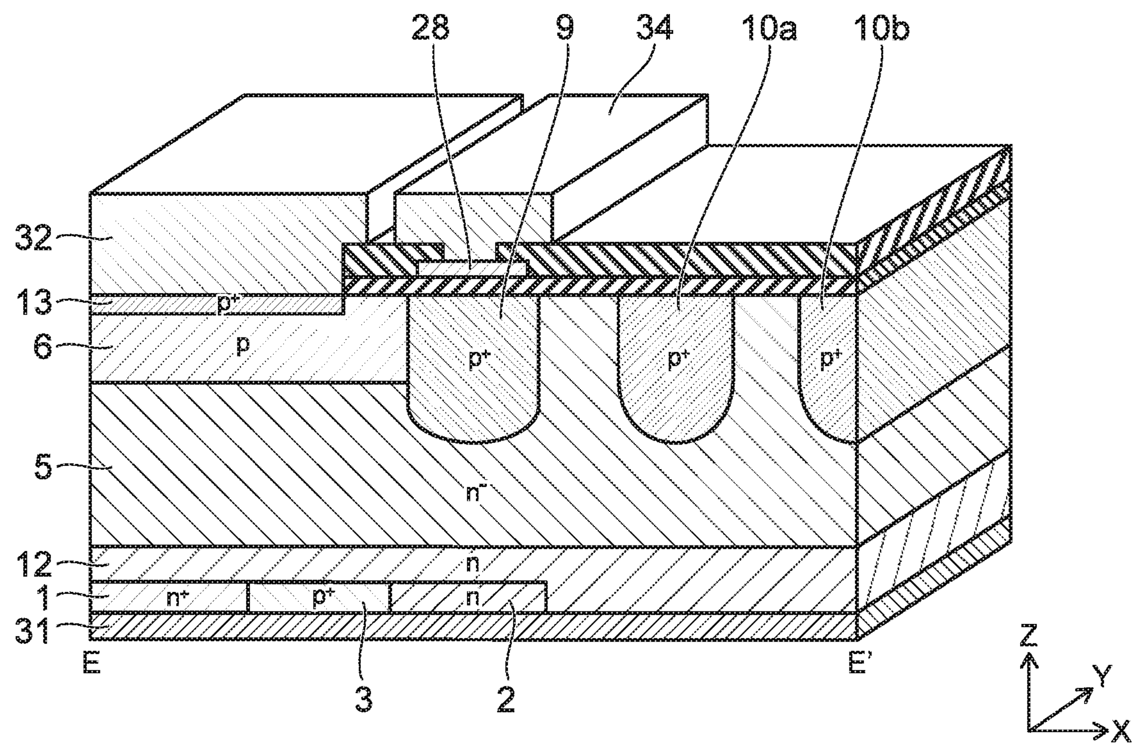

FIGS. 4A and 4B are a perspective cross-sectional view including a D-D' cross section of FIG. 1 and a perspective cross-sectional view including an E-E' cross section of FIG. 1.

Figure 5:
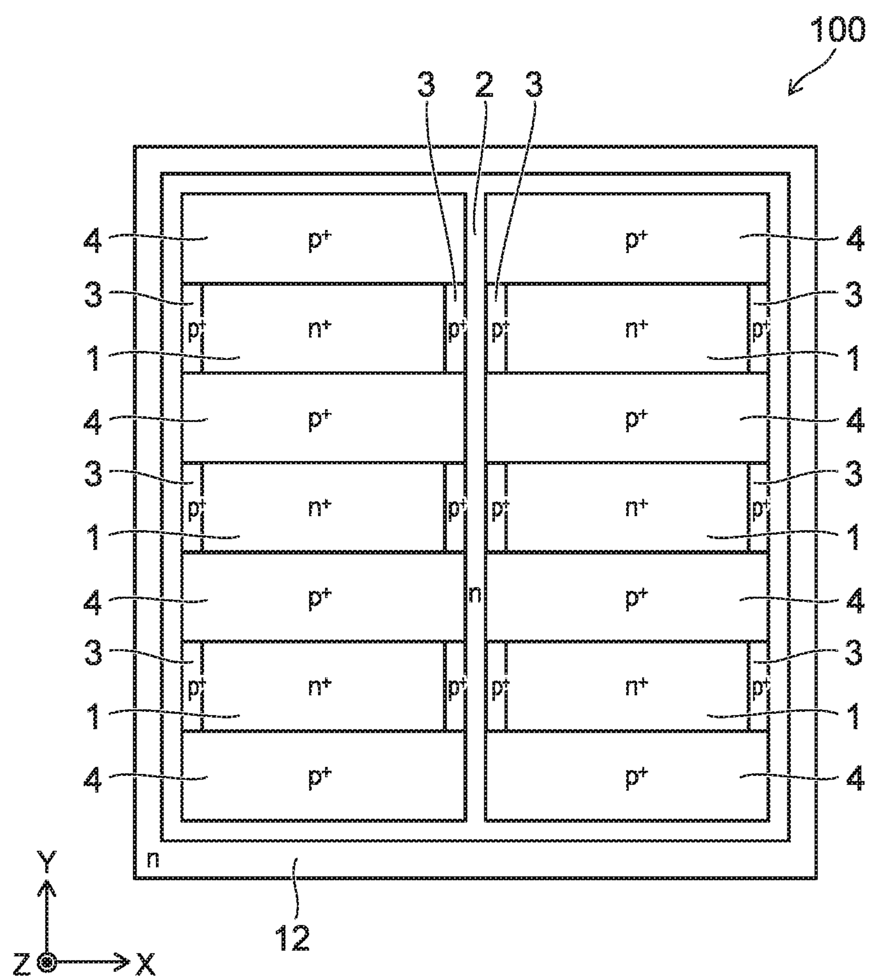
FIG. 5 is a plan view illustrating the structure of the lower surface of the semiconductor device according to the embodiment.

FIG. 5 is a plan view illustrating the structure of the lower surface of the semiconductor device according to the embodiment.

An emitter electrode 32 is illustrated as being see-through in FIG. 2.

As illustrated in FIG. 1 to FIG. 5, the semiconductor device 100 according to the embodiment includes an $n^+$-type (first conductivity-type) cathode region 1 (a first semiconductor region), a semiconductor region 2 (a second semiconductor region), a $p^+$-type (second conductivity-type) semiconductor region 3 (a third semiconductor region), a $p^+$-type collector region 4 (a fourth semiconductor region), an $n^-$-type semiconductor region 5 (a fifth semiconductor region), a p-type anode region 6 (a sixth semiconductor region), a p-type base region 7 (a seventh semiconductor region), an $n^+$-type emitter region 8 (an eighth semiconductor region), a $p^+$-type guard ring region 9 (a ninth semiconductor region), an n-type buffer region 12, a $p^+$-type anode 13, a $p^+$-type contact region 14, a gate electrode 20, a conductive layer 25, a collector electrode 31 (a first electrode), an emitter electrode 32 (a second electrode), and a gate pad 33.

An XYZ orthogonal coordinate system is used in the description of the embodiments. A direction in which the $n^+$-type cathode region 1, the $p^+$-type semiconductor region 3, and the semiconductor region 2 are arranged is taken as an X-direction (a first direction). A direction perpendicular to the X-direction in which the $n^+$-type cathode region 1 and the $p^+$-type collector region 4 are arranged is taken as a Y-direction (a second direction). A direction perpendicular to the X-direction and the Y-direction is taken as a Z-direction (a third direction). For the description, the direction from the $n^+$-type cathode region 1 and the $p^+$-type collector region 4 toward the $n^-$-type semiconductor region 5 is called "up;" and the reverse direction is called "down." These directions are based on the relative positional relationship of the $n^+$-type cathode region 1, the $p^+$-type collector region 4, and the $n^-$-type semiconductor region 5 and are independent of the direction of gravity.

As illustrated in FIG. 1, the emitter electrode 32 and the gate pad 33 are provided at the upper surface of the semiconductor device 100 and are separated from each other. For example, the emitter electrode 32 is multiply provided in the X-direction. An interconnect layer 34 is provided around the emitter electrodes 32. The interconnect layer 34 is connected to the gate pad 33. For example, a portion of the interconnect layer 34 extends in the Y-direction between the emitter electrodes 32.

The semiconductor device 100 includes an IGBT region R1 and a FWD region R2. In the example illustrated in FIG. 1, the IGBT region R1 and the FWD region R2 each are multiply provided in the X-direction and the Y-direction. The emitter electrodes 32 each are provided on the IGBT regions R1 and the FWD regions R2 provided alternately in the Y-direction.

As illustrated in FIG. 2 to FIG. 3B, the collector electrode 31 is provided at the lower surface of the semiconductor device 100. The $n^+$-type cathode region 1, the semiconductor region 2, the $p^+$-type semiconductor region 3, and the $p^+$-type collector region 4 are provided on the collector electrode 31 and are electrically connected to the collector electrode 31.

As illustrated in FIG. 5, a portion of the semiconductor region 2 is separated from the $n^+$-type cathode region 1 in the X-direction. The $p^+$-type semiconductor region 3 is provided between the $n^+$-type cathode region 1 and the semiconductor region 2 in the X-direction. The $p^+$-type collector region 4 is arranged with the $n^+$-type cathode region 1 and the $p^+$-type semiconductor region 3 in the Y-direction. The $p^+$-type collector region 4 is arranged with another portion of the semiconductor region 2 in the X-direction.

In the example illustrated in FIG. 5, the $n^+$-type cathode region 1 is provided between a pair of $p^+$-type semiconductor regions 3 in the X-direction. The $n^+$-type cathode region 1 and the pair of $p^+$-type semiconductor regions 3 are provided between portions of the semiconductor region 2 in the X-direction. For example, the semiconductor region 2 is provided around the multiple $n^+$-type cathode regions 1, the multiple $p^+$-type semiconductor regions 3, and the multiple $p^+$-type collector regions 4.

As illustrated in FIG. 2 to FIG. 3B, the n-type buffer region 12 is provided on the $n^+$-type cathode region 1, the semiconductor region 2, the $p^+$-type semiconductor region 3, and the $p^+$-type collector region 4. The semiconductor region 2 may be provided as one body with the n-type buffer region 12. The $n^-$-type semiconductor region 5 is provided on the n-type buffer region 12.

The p-type anode region 6 is provided on the $n^-$-type semiconductor region 5 and is positioned on the $n^+$-type cathode region 1 and the $p^+$-type semiconductor region 3. The $p^+$-type anode 13 is provided on a portion of the p-type anode region 6. For example, the conductive layer 25 opposes, with an insulating layer 26 interposed in the Y-direction, the p-type anode region 6 and a portion of the $n^-$-type semiconductor region 5.

The p-type base region 7 is provided on the $n^-$-type semiconductor region 5 and positioned on the $p^+$-type collector region 4. The $n^+$-type emitter region 8 and the $p^+$-type contact region 14 are provided on the p-type base region 7. For example, the gate electrode 20 opposes, with a gate insulating layer 21 interposed in the Y-direction, the p-type base region 7, a portion of the $n^-$-type semiconductor region 5, and at least a portion of the $n^+$-type emitter region 8.

The emitter electrode 32 is provided on the p-type anode region 6, the $p^+$-type anode 13, the $n^+$-type emitter region 8, the $p^+$-type contact region 14, and the conductive layer 25 and is electrically connected to these components. The gate electrode 20 and the emitter electrode 32 are electrically isolated from each other.

As illustrated in FIG. 3A to FIG. 4B, the $p^+$-type guard ring region 9 is provided around the p-type anode region 6 and the p-type base region 7 and is positioned on the semiconductor region 2. A portion of the $p^+$-type guard ring region 9 is provided between the gate electrodes 20 and between the conductive layers 25 in the X-direction. The $p^+$-type guard ring region 9 is electrically connected to the emitter electrode 32 via the p-type anode region 6 and the p-type base region 7. A conductive layer 28 is provided on the $p^+$-type guard ring region 9 with an insulating layer interposed. The conductive layer 28 is connected to the gate electrode 20 and the interconnect layer 34. In other words, the gate electrode 20 is electrically connected to the gate pad 33 via the conductive layer 28 and the interconnect layer 34.

As illustrated in FIGS. 4A and 4B, a $p^+$-type guard ring region 10*a* and a $p^+$-type guard ring region 10*b* may be provided around the $p^+$-type guard ring region 9. The $p^+$-type guard ring region 10*a* is separated from the $p^+$-type guard ring region 9. The $p^+$-type guard ring region 10*b* is separated from the $p^+$-type guard ring region 10*a*.

Examples of the materials of the components of the semiconductor device 100 will now be described.

The $n^+$-type cathode region 1, the semiconductor region 2, the $p^+$-type semiconductor region 3, the $p^+$-type collector region 4, the $n^-$-type semiconductor region 5, the p-type anode region 6, the p-type base region 7, the $n^+$-type emitter region 8, the $p^+$-type guard ring region 9, the $p^+$-type guard ring region 10, the n-type buffer region 12, the $p^+$-type anode 13, and the $p^+$-type contact region 14 include silicon, silicon carbide, gallium nitride, or gallium arsenide as a semiconductor material. In the case where silicon is used as the semiconductor material, arsenic, phosphorus, or antimony can be used as an n-type impurity. Boron can be used as a p-type impurity.

The gate electrode 20 and the conductive layer 25 include a conductive material such as polysilicon, etc.

The gate insulating layer 21 and the insulating layer 26 include an insulating material such as silicon oxide, etc.

The collector electrode 31, the emitter electrode 32, the gate pad 33, and the interconnect layer 34 include a metal such as aluminum, etc.

Operations of the semiconductor device 100 will now be described.

A channel (an inversion layer) is formed in the region of the p-type base region 7 at the gate insulating layer 21 vicinity when a voltage that is not less than a threshold is applied to the gate electrode 20 in a state in which a voltage that is positive with respect to the emitter electrode 32 is applied to the collector electrode 31. The IGBT region R1 is set to an on-state. At this time, electrons pass through the channel and are injected into the $n^-$-type semiconductor region 5 from the $n^+$-type emitter region 8. Holes are injected from the $p^+$-type collector region 4 into the $n^-$-type semiconductor region 5. Subsequently, when the voltage applied to the gate electrode 20 becomes lower than the threshold, the channel in the p-type base region 7 disappears; and the IGBT region R1 is set to an off-state.

For example, a bridge circuit is configured using multiple semiconductor devices 100. In such a case, when one semiconductor device 100 switches from the on-state to the off-state, an induced electromotive force is applied to the emitter electrode 32 of another semiconductor device 100 due to the inductance component of the bridge circuit. Thereby, the FWD region R2 operates in the other semiconductor device 100. Holes are injected from the p-type anode region 6 (the $p^+$-type anode 13) into the $n^-$-type semiconductor region 5; and electrons are injected from the $n^+$-type cathode region 1 into the $n^-$-type semiconductor region 5.

Effects of the embodiment will now be described with reference to FIGS. 6A and 6B.

Figure 6A:
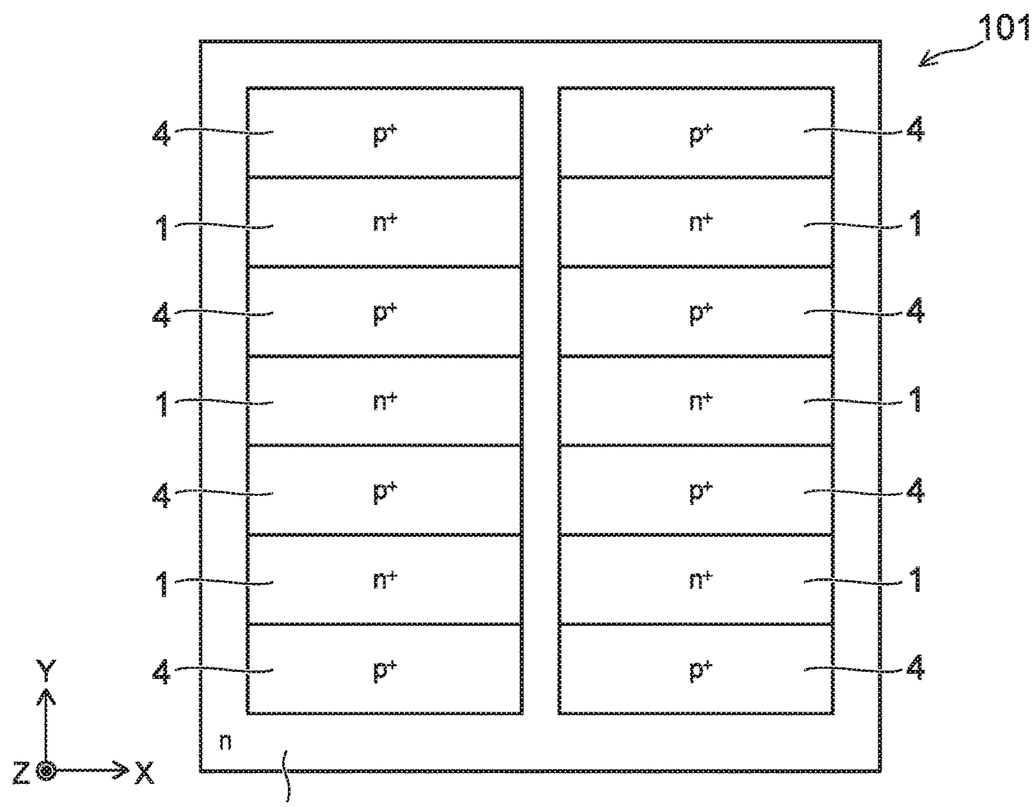
FIGS. 6A and 6B are plan views illustrating the structure of the lower surface for semiconductor devices according to reference examples.
Figure 6B:
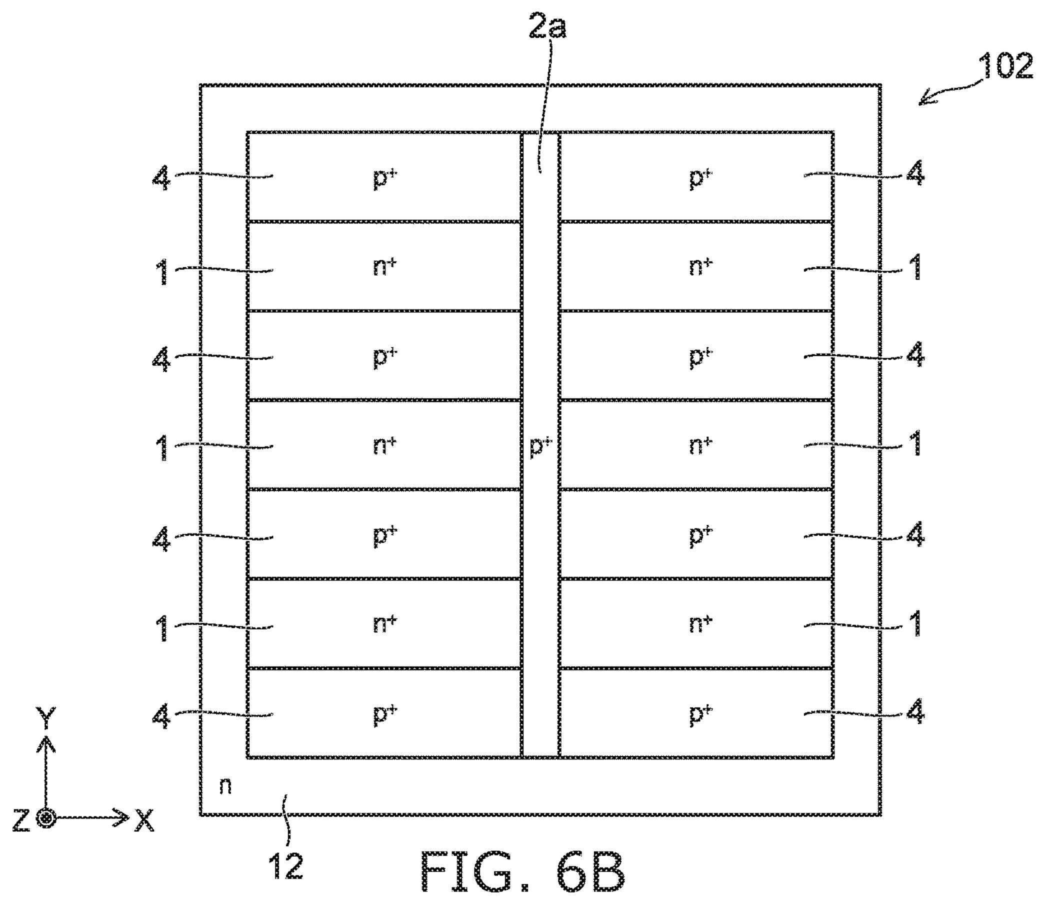

FIGS. 6A and 6B are plan views illustrating the structure of the lower surface for semiconductor devices according to reference examples.

The $p^+$-type semiconductor region 3 is not provided in a semiconductor device 101 illustrated in FIG. 6A. A portion of the n-type buffer region 12 is provided between the $n^+$-type cathode regions 1 and between the $p^+$-type collector regions 4. The $p^+$-type semiconductor region 3 is not provided in a semiconductor device 102 illustrated in FIG. 6B. A $p^+$-type semiconductor region 2*a* is provided between the $n^+$-type cathode regions 1 and between the $p^+$-type collector regions 4.

When the semiconductor device is turned off, the semiconductor device transitions to an avalanche state when a large voltage with respect to the emitter electrode 32 is applied to the collector electrode 31 due to an induced electromotive force, etc. At this time, impact ionization occurs at the bottom portion of the gate insulating layer 21 and/or the bottom portion of the insulating layer 26; and electrons and holes are generated in the $n^-$-type semiconductor region 5. The generated electrons drift toward the collector electrode 31 and reduce the potential of the $n^-$-type semiconductor region 5 on the collector electrode 31 side. At this time, the built-in potential between the $n^-$-type semiconductor region 5 and the $p^+$-type collector region 4 decreases. Thereby, the holes are injected from the $p^+$-type collector region 4 into the $n^-$-type semiconductor region 5; and a current flows in the semiconductor device.

The ease of the occurrence of the impact ionization is different between the gate insulating layer 21 and the insulating layer 26 due to fluctuation of the depths and the configurations of the gate insulating layer 21 and the insulating layer 26. In the case where impact ionization occurs concentratively in a portion of the gate insulating layer 21 or the insulating layer 26, a current flows concentratively in the $p^+$-type collector region 4 (the IGBT region R1) at the vicinity of the impact ionization; and a current filament occurs. The temperature increases as time elapses in the location where the current filament occurs. When the temperature increases, the impact ionization occurs less easily because the mean free path of the carriers becomes short. Accordingly, when the temperature increases, the current filament moves to an adjacent region where the temperature is low.

In the FWD region R2 where the $n^+$-type cathode region 1 is provided on the lower surface, the holes are not injected from the collector electrode 31. Therefore, the current filament does not move into the FWD region R2. Accordingly, in the case of the semiconductor device 101 according to the reference example, the current filament continues to move inside one IGBT region R1.

For example, in the case where the temperature at the center of the IGBT region R1 increases, a portion of the current filament moves toward the vicinity of the boundary with the FWD region R2. At this time, the current filament does not move into the FWD region R2 and does not move toward the center of the IGBT region R1 where the temperature increased. Therefore, the current filament continues to occur at the vicinity of the boundary between the IGBT region R1 and the FWD region R2. As a result, the temperature at the boundary vicinity recited above continues to increase due to the current filament. Ultimately, breakdown of the semiconductor device 101 occurs due to thermal runaway.

For this problem, in the semiconductor device 102 according to the reference example, the $p^+$-type semiconductor region 2*a* is provided between the $n^+$-type cathode regions 1 and between the $p^+$-type collector regions 4 in the X-direction. The multiple $p^+$-type collector regions 4 are electrically connected to each other by the $p^+$-type semiconductor region 2*a*. By providing the $p^+$-type semiconductor region 2*a*, the holes are injected from the collector electrode 31 into the $n^-$-type semiconductor region 5 via the $p^+$-type semiconductor region 2*a*. Therefore, the current filament may move into the $p^+$-type semiconductor region 2*a* on the outer side of the IGBT region R1 and may move into another IGBT region R1. Thereby, the local increase of the temperature is suppressed. The likelihood of breakdown of the semiconductor device 102 due to the current filament can be reduced.

On the other hand, to increase the breakdown voltage when the semiconductor device is in the off-state, it is desirable to provide the $p^+$-type guard ring region 9 around the IGBT regions R1 and the FWD regions R2. By providing the $p^+$-type guard ring region 9, the electric field concentration at the gate insulating layer 21 lower end and the insulating layer 26 lower end is relaxed.

In the case where the $p^+$-type guard ring region 9 is provided in the semiconductor device 102, the $p^+$-type guard ring region 9 is positioned on the $p^+$-type semiconductor region 2*a*. In other words, a parasitic PNP transistor is formed of the $p^+$-type semiconductor region 2*a*, the $n^-$-type semiconductor region 5, and the $p^+$-type guard ring region 9. When a current filament flows in the parasitic transistor and the temperature of the $n^-$-type semiconductor region 5 increases, the parasitic transistor operates easily.

For the problems described above, in the embodiment, the $p^+$-type semiconductor region 3 and the semiconductor region 2 which is of the n-type are provided. The semiconductor region 2 is provided under the $p^+$-type guard ring region 9. The $p^+$-type semiconductor region 3 is provided between the semiconductor region 2 and the $n^+$-type cathode region 1.

According to this configuration, compared to the case where the $p^+$-type semiconductor region 2*a* is provided under the $p^+$-type guard ring region 9, injection of the holes into the $n^-$-type semiconductor region 5 directly under the $p^+$-type guard ring region 9 is suppressed. Thereby, the operation of the parasitic transistor can be suppressed. By providing the $p^+$-type semiconductor region 3 adjacent to the semiconductor region 2, the current filament can move between the IGBT regions R1 via the $p^+$-type semiconductor region 3.

In other words, according to the embodiment, the likelihood of breakdown of the semiconductor device due to the current filament and the operation of the parasitic transistor can be reduced.

As illustrated in FIGS. 3A and 3B, it is desirable for a width W1 of the semiconductor region 2 to be wider than a width W2 of the $p^+$-type guard ring region 9. By setting the width W1 to be wider than the width W2, the $p^+$-type semiconductor region 3 and the $p^+$-type guard ring region 9 do not oppose each other in the vertical direction. Thereby, a parasitic PNP transistor that is made of the $p^+$-type semiconductor region 3, the $n^-$-type semiconductor region 5, and the $p^+$-type guard ring region 9 does not operate easily.

In other words, the width of the semiconductor region 2 is the length in the X-direction of the portion of the semiconductor region 2 extending in the Y-direction or the length in the Y-direction of the portion of the semiconductor region 2 extending in the X-direction.

Similarly, the width of the $p^+$-type guard ring region 9 is the length in the X-direction of the portion of the $p^+$-type guard ring region 9 extending in the Y-direction or the length in the Y-direction of the portion of the $p^+$-type guard ring region 9 extending in the X-direction.

In the case where the semiconductor region 2 of the n-type is provided, when a voltage with respect to the collector electrode 31 is applied to the emitter electrode 32, a current flows also in a diode including the semiconductor region 2, the n-type buffer region 12, the $n^-$-type semiconductor region 5, and the $p^+$-type guard ring region 9. For example, the design is such that injection of the holes into the FWD region R2 is suppressed and the FWD region R2 operates at a high speed. In such a case, the operation speed of the diode decreases when the holes are injected into the $n^-$-type semiconductor region 5 via the $p^+$-type guard ring region 9. To suppress the injection amount of the holes from the $p^+$-type guard ring region 9, it is effective to reduce the injection amount of the electrons from the semiconductor region 2. Therefore, it is desirable for the n-type impurity concentration in the semiconductor region 2 to be lower than the n-type impurity concentration in the $n^+$-type cathode region 1.

It is desirable for a width W3 of the $p^+$-type semiconductor region 3 to be set to a length that a current filament passes through easily. It is desirable for the width W3 to be 200 μm or more. It is desirable for the width W2 to be narrower than the width W3 of the $p^+$-type semiconductor region 3. The $p^+$-type guard ring region 9 and the $n^-$-type semiconductor region 5 are included in a parasitic diode. By setting the width W2 to be narrow, the surface area of the $p^+$-type guard ring region 9 functioning as the anode region can be reduced. The injection amount of the holes of the parasitic diode can be reduced.

In other words, the width of the $p^+$-type semiconductor region 3 is the length in the X-direction of the portion of the $p^+$-type semiconductor region 3 extending in the Y-direction or the length in the Y-direction of the portion of the $p^+$-type semiconductor region 3 extending in the X-direction.

First Modification

Figure 7:
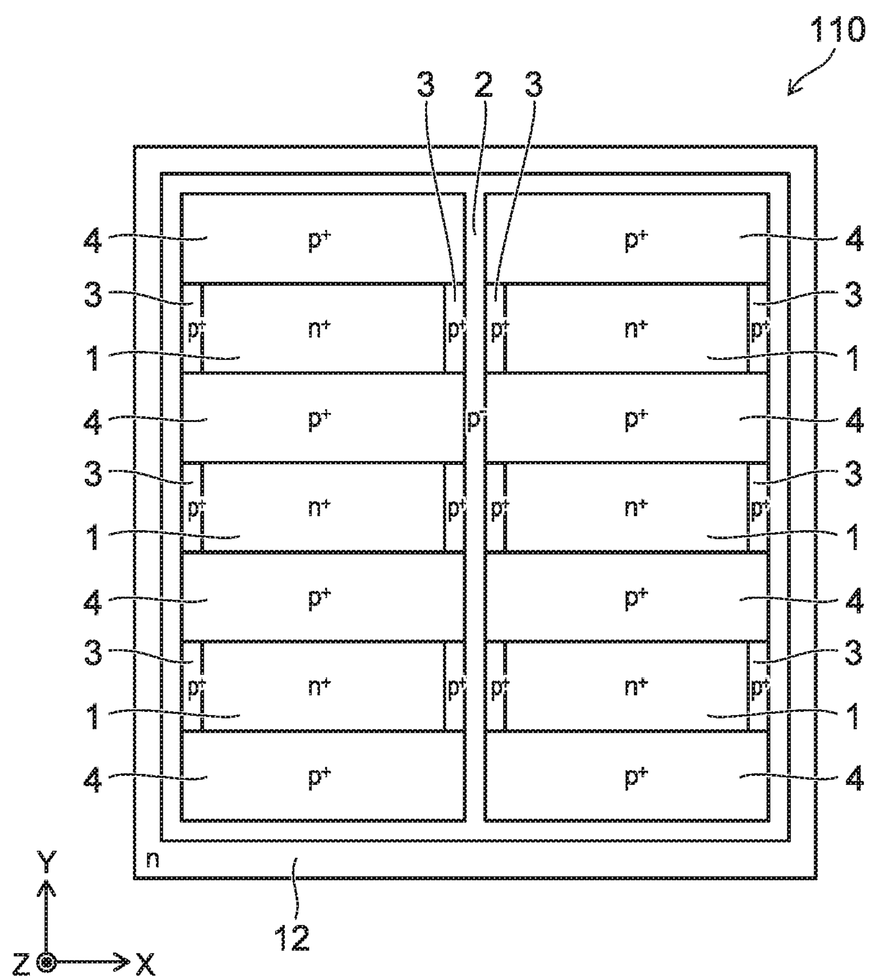
FIG. 7 is a plan view illustrating the structure of the lower surface of a semiconductor device according to a first modification of the embodiment.

FIG. 7 is a plan view illustrating the structure of the lower surface of a semiconductor device according to a first modification of the embodiment.

As illustrated in FIG. 7, the semiconductor region 2 that is of the $p^-$-type is provided in the semiconductor device 110 according to the first modification. In other words, the p-type impurity concentration in the semiconductor region 2 is lower than the p-type impurity concentrations in the $p^+$-type semiconductor region 3 and the $p^+$-type collector region 4.

For example, the p-type peak impurity concentration in the $p^+$-type semiconductor region 3 is not less than $8.0 \times 10^{16}$ atoms/cm$^3$ and not more than $1.0 \times 10^{19}$ atoms/cm$^3$. The p-type peak impurity concentration in the semiconductor region 2 is $5.0 \times 10^{16}$ atoms/cm$^3$ or less. Thus, if the p-type impurity concentration in the semiconductor region 2 is lower than the p-type impurity concentration in the $p^+$-type semiconductor region 3, the conductivity type of the semiconductor region 2 may be either the n-type or the p-type.

Even in the case where the semiconductor region 2 is of the p-type, the injection of the holes into the $n^-$-type semiconductor region 5 directly under the $p^+$-type guard ring region 9 can be suppressed by setting the p-type impurity concentration in the semiconductor region 2 to be low. Therefore, similarly to the semiconductor device 100, the likelihood of breakdown of the semiconductor device due to the current filament and the operation of the parasitic transistor can be reduced.

In the case where the semiconductor region 2 is of the p-type, the operation of the diode including the $n^-$-type semiconductor region 5 and the $p^+$-type guard ring region 9 when the FWD region R2 operates can be suppressed. Therefore, the diode operation of the semiconductor device 110 can be faster.

Second Modification

Figure 8:
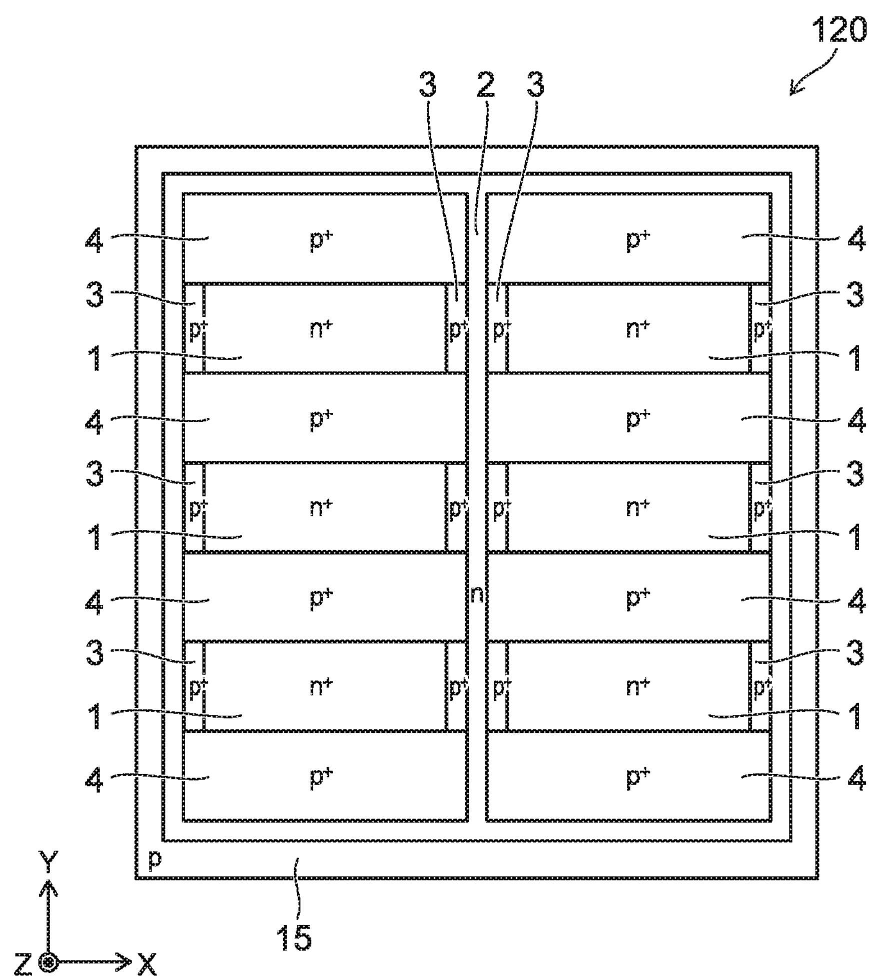
FIG. 8 is a plan view illustrating the structure of the lower surface of a semiconductor device according to a second modification of the embodiment.

FIG. 8 is a plan view illustrating the structure of the lower surface of a semiconductor device according to a second modification of the embodiment.

In the semiconductor device 120 according to the second modification as illustrated in FIG. 8, a p-type semiconductor region 15 is provided instead of a portion of the n-type buffer region 12 around the $n^+$-type cathode region 1, the semiconductor region 2, the $p^+$-type semiconductor region 3, and the $p^+$-type collector region 4. According to the semiconductor device 120 according to the modification as well, similarly to the semiconductor device 100, it is possible to reduce the likelihood of breakdown of the semiconductor device due to the current filament and the operation of the parasitic transistor.

Third Modification

Figure 9:
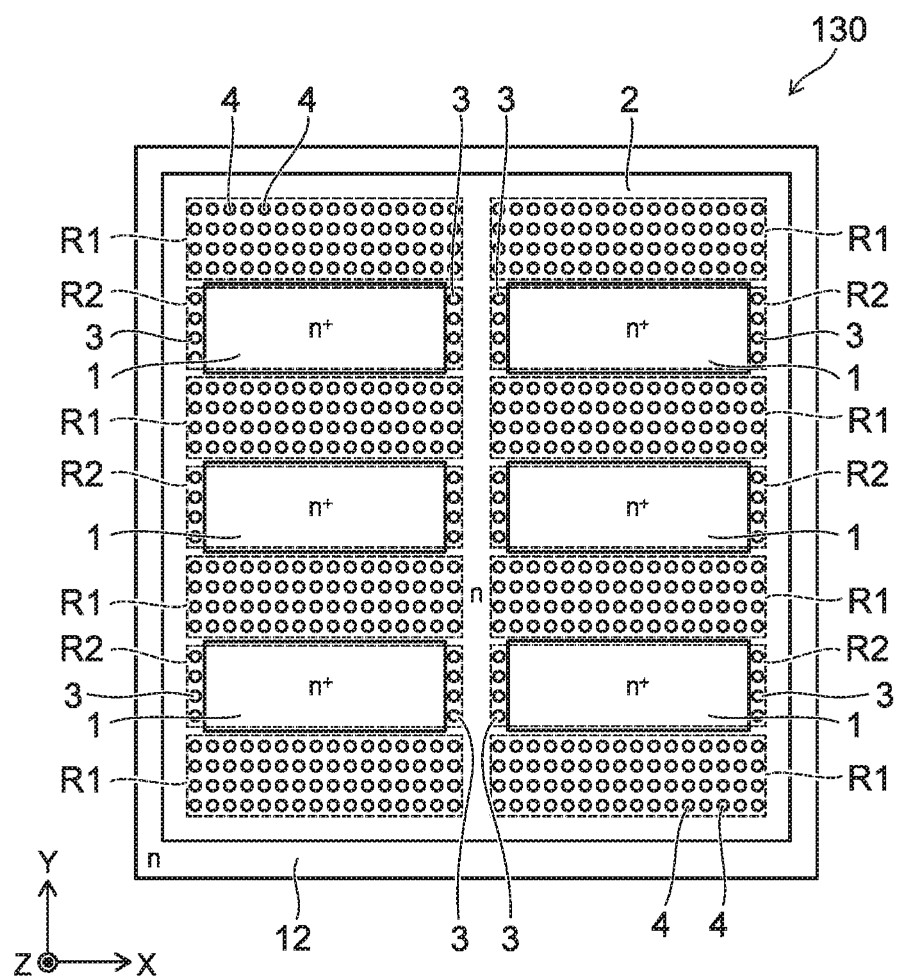
FIG. 9 is a plan view illustrating the structure of the lower surface of a semiconductor device according to a third modification of the embodiment.

FIG. 9 is a plan view illustrating the structure of the lower surface of a semiconductor device according to a third modification of the embodiment.

The semiconductor region 2 that is of the n-type is provided around the $n^+$-type cathode region 1 in the semiconductor device 130 according to the third modification. The multiple $p^+$-type semiconductor regions 3 are provided adjacent to the $n^+$-type cathode region 1 in the X-direction. The multiple $p^+$-type semiconductor regions 3 are arranged along the Y-direction.

The multiple $p^+$-type collector regions 4 are provided inside the semiconductor region 2 in the IGBT region R1. The multiple $p^+$-type collector regions 4 are arranged along the X-direction and the Y-direction. The $n^+$-type cathode region 1 and the multiple $p^+$-type semiconductor regions 3 that are provided in the FWD region R2 are provided between the multiple $p^+$-type collector regions 4 and other multiple $p^+$-type collector regions 4 in the Y-direction.

The distance between the $p^+$-type semiconductor regions 3, the distance between the $p^+$-type collector regions 4, and the distance between the $p^+$-type semiconductor region 3 and the $p^+$-type collector region 4 each are set so that the current filament can move between these regions. For example, these distances are less than the lengths of the $p^+$-type semiconductor region 3 and the $p^+$-type collector region 4 in the X-direction or the Y-direction and are 10 μm or less.

According to the semiconductor device 130 according to the modification as well, similarly to the semiconductor device 100, it is possible to reduce the likelihood of breakdown of the semiconductor device due to the current filament and the operation of the parasitic transistor.

By setting the multiple $p^+$-type collector regions 4 to be separated from each other in the IGBT region R1, the effective p-type impurity concentration at the lower surface of the IGBT region R1 can be reduced. Thereby, injection of the holes from the lower surface when the IGBT region R1 is operated is suppressed. The switching time can be shortened; and the switching loss can be reduced.

Fourth Modification

Figure 10:
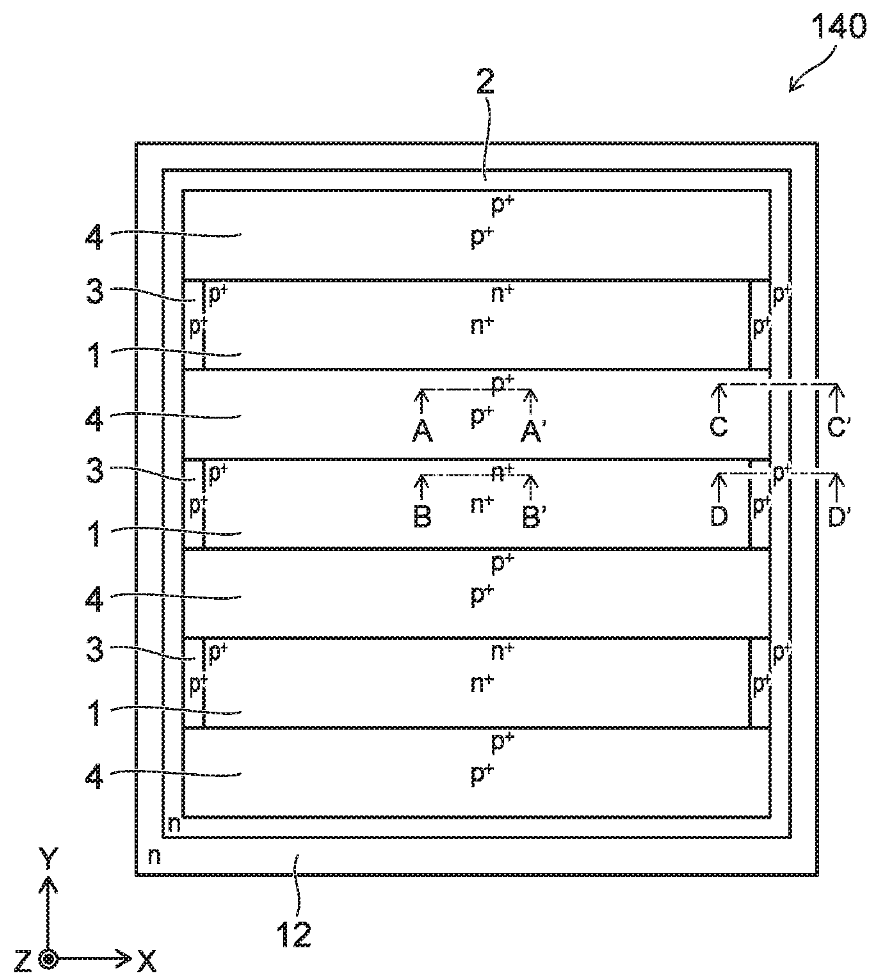
FIG. 10 is a plan view illustrating the structure of the lower surface of a semiconductor device according to a fourth modification of the embodiment.

FIG. 10 is a plan view illustrating the structure of the lower surface of a semiconductor device according to a fourth modification of the embodiment.

Figure 11A:
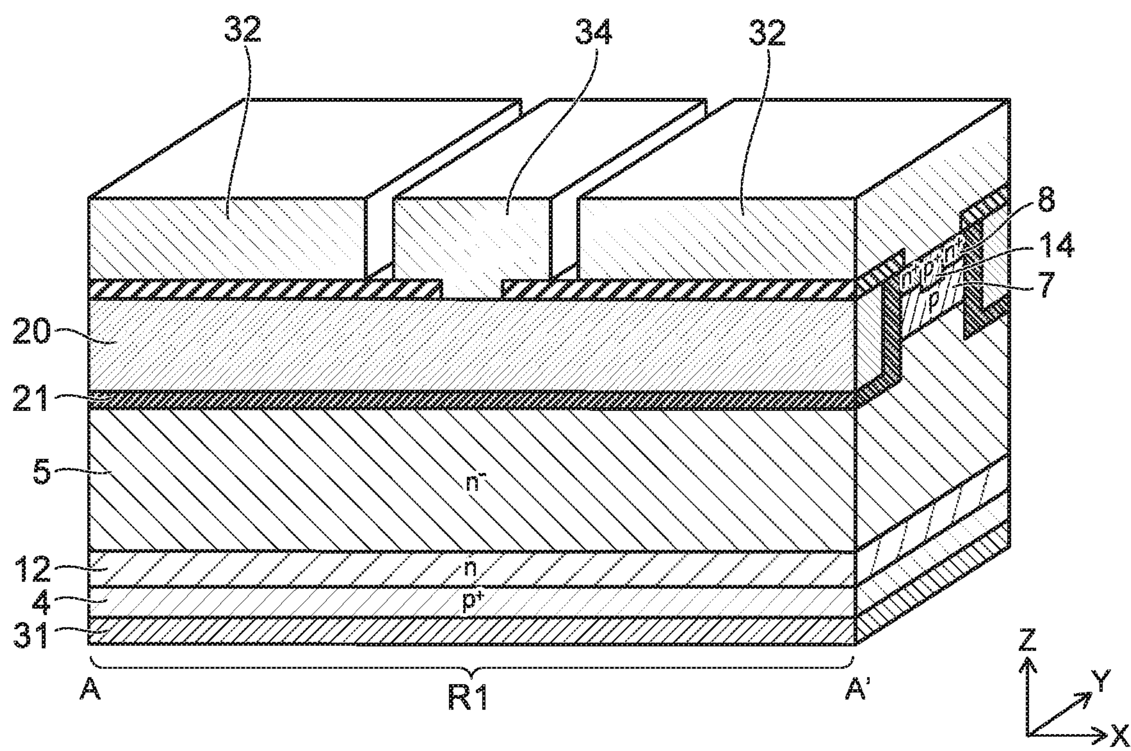
FIGS. 11A and 11B are an A-A' cross-sectional view and a B-B' cross-sectional view of FIG. 10.
Figure 11B:
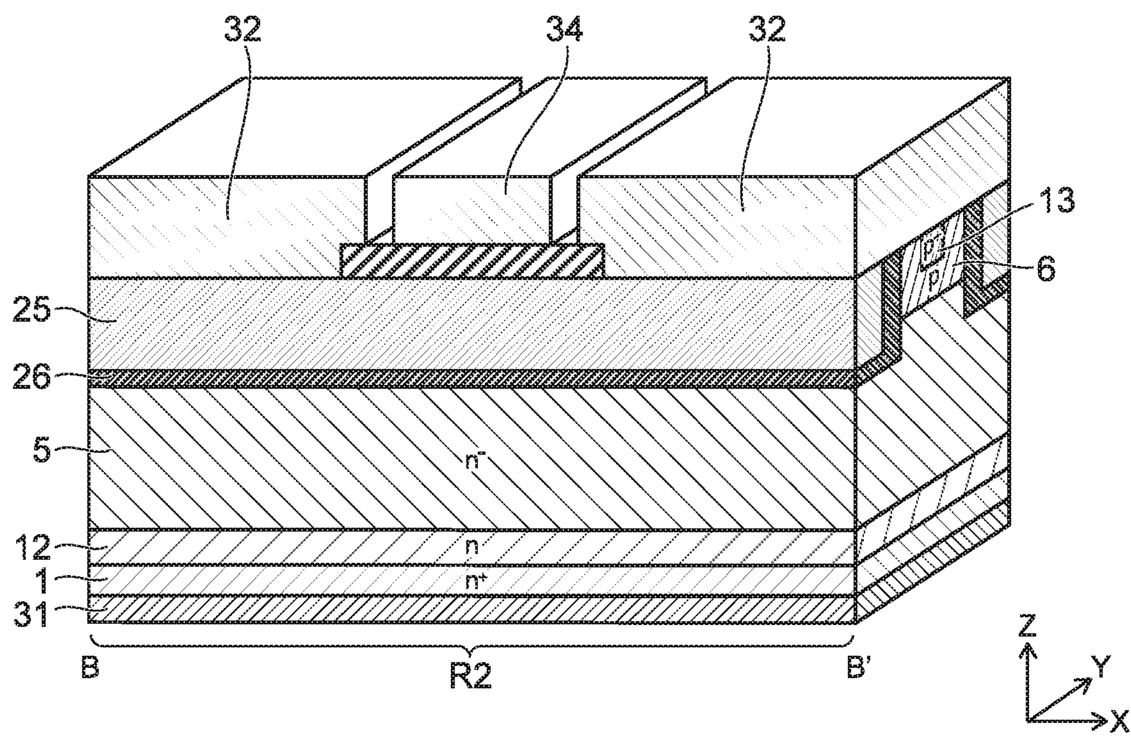

FIGS. 11A and 11B are an A-A' cross-sectional view and a B-B' cross-sectional view of FIG. 10.

Figure 12A:
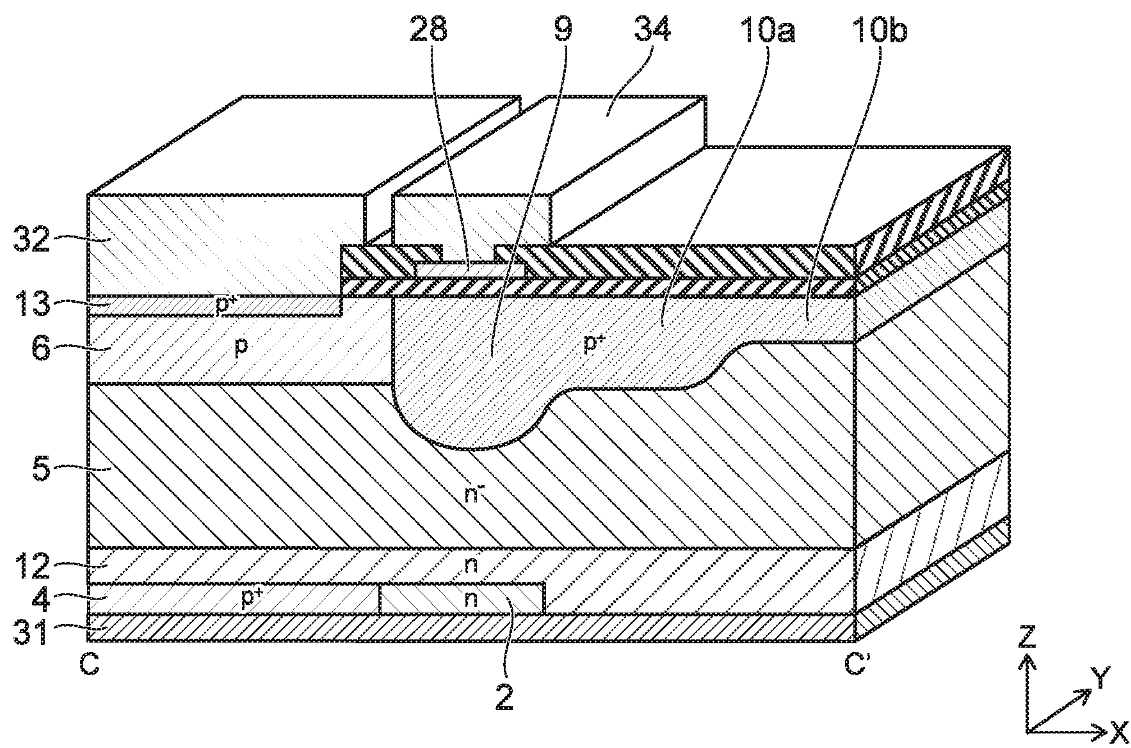
FIGS. 12A and 12B are a C-C' cross-sectional view and a D-D' cross-sectional view of FIG. 10.
Figure 12B:
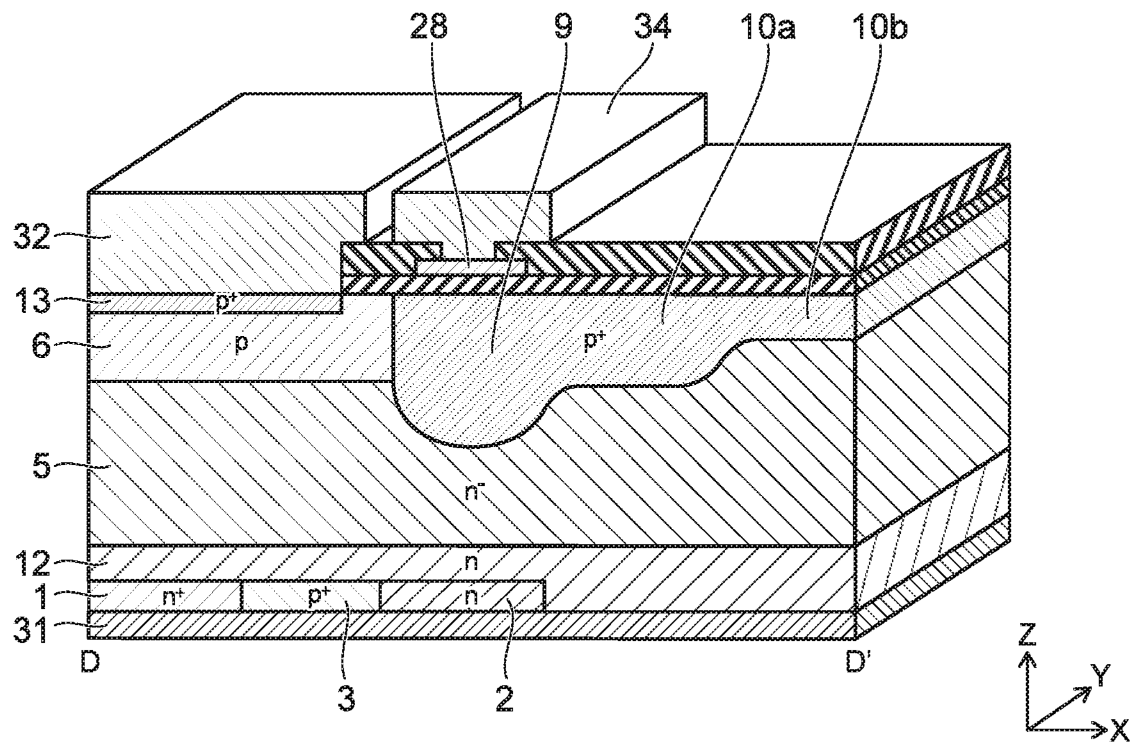

FIGS. 12A and 12B are a C-C' cross-sectional view and a D-D' cross-sectional view of FIG. 10.

In the semiconductor device 100, the semiconductor region 2 is provided between the IGBT regions R1 and between the FWD regions R2. Conversely, in the semiconductor device 140 according to the fourth modification, the semiconductor region 2 is not provided between the IGBT regions R1 and between the FWD regions R2 as illustrated in FIG. 10.

In the semiconductor device 140 as illustrated in FIGS. 11A and 11B, the $p^+$-type guard ring region 9 is not provided under the interconnect layer 34; and the gate electrode 20 and the conductive layer 25 extend to be continuous in the X-direction. Therefore, the semiconductor region 2 is not provided under the interconnect layer 34.

As illustrated in FIGS. 12A and 12B, the semiconductor region 2 and the $p^+$-type guard ring region 9 are provided only at the outer perimeter of the semiconductor device 140. In the example of FIGS. 12A and 12B, the $p^+$-type guard ring region 10*a* is provided to be continuous with the $p^+$-type guard ring region 9 around the $p^+$-type guard ring region 9. The $p^+$-type guard ring region 10*b* is provided to be continuous with the $p^+$-type guard ring region 10*a* around the $p^+$-type guard ring region 10*a*. The position of the lower end of the $p^+$-type guard ring region 10*a* is positioned higher than the position of the lower end of the $p^+$-type guard ring region 9 and positioned lower than the position of the lower end of the $p^+$-type guard ring region 10*b*. As illustrated in FIGS. 4A and 4B, the $p^+$-type guard ring region 10 may be separated from the $p^+$-type guard ring region 9.

Thus, it is possible to appropriately modify the position where the semiconductor region 2 is provided according to the position where the $p^+$-type guard ring region 9 is provided. The $p^+$-type semiconductor region 3 is provided between the semiconductor region 2 and the $n^+$-type cathode region 1; and the $p^+$-type collector regions 4 are connected to each other by the $p^+$-type semiconductor region 3. Thereby, the current filament can move between the IGBT regions R1. Therefore, similarly to the semiconductor device 100, the likelihood of breakdown of the semiconductor device due to the current filament and the operation of the parasitic transistor can be reduced.

The embodiments described above may be carried out in combination as appropriate. For example, the conductivity type of the semiconductor region 2 may be the p-type in the semiconductor devices 120 to 140. The p-type semiconductor region 15 may be provided instead of a portion of the n-type buffer region 12 in the semiconductor devices 110, 130, and 140. In the semiconductor devices 110 and 120, the multiple $p^+$-type collector regions 4 may be arranged in the IGBT region R1; and the multiple $p^+$-type semiconductor regions 3 may be arranged in the FWD region R2.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM.

It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:

a first electrode;

a first semiconductor region provided on the first electrode, the first semiconductor region being of a first conductivity type;

a second semiconductor region provided around the first semiconductor region;

a plurality of third semiconductor regions provided inside the second semiconductor region, the plurality of third semiconductor regions being of a second conductivity type and being adjacent to the first semiconductor region in a first direction, an impurity concentration of the second conductivity type in each of the plurality of third semiconductor regions being higher than an impurity concentration of the second conductivity type in the second semiconductor region;

a plurality of fourth semiconductor regions provided inside the second semiconductor region, the plurality of fourth semiconductor regions being of the second conductivity type and being arranged with the first semiconductor region and the plurality of third semiconductor regions in a second direction perpendicular to the first direction;

a fifth semiconductor region provided on the first semiconductor region, the second semiconductor region, the plurality of third semiconductor regions, and the plurality of fourth semiconductor regions, the fifth semiconductor region being of the first conductivity type;

a sixth semiconductor region provided on the fifth semiconductor region and positioned on the first semiconductor region, the sixth semiconductor region being of the second conductivity type;

a seventh semiconductor region provided on the fifth semiconductor region and positioned on the plurality of fourth semiconductor regions, the seventh semiconductor region being of the second conductivity type;

an eighth semiconductor region provided on a portion of the seventh semiconductor region, the eighth semiconductor region being of the first conductivity type;

a gate electrode opposing, with a gate insulating layer interposed, the seventh semiconductor region, a portion of the fifth semiconductor region, and at least a portion of the eighth semiconductor region;

a ninth semiconductor region provided around the sixth semiconductor region and the seventh semiconductor region and positioned on the second semiconductor region, the ninth semiconductor region being of the second conductivity type, an impurity concentration of the second conductivity type in the ninth semiconductor region being higher than impurity concentrations of the second conductivity type in the sixth semiconductor region and the seventh semiconductor region; and a second electrode provided on the sixth semiconductor region, the seventh semiconductor region, and the eighth semiconductor region, the second electrode being electrically connected to the sixth semiconductor region, the seventh semiconductor region, the eighth semiconductor region, and the ninth semiconductor region.

2. The device according to claim 1, wherein the second semiconductor region is of the first conductivity type, and an impurity concentration of the first conductivity type in the second semiconductor region is lower than an impurity concentration of the first conductivity type in the first semiconductor region.

3. The device according to claim 1, wherein the second semiconductor region is of the second conductivity type, and a peak impurity concentration of the second conductivity type in the second semiconductor region is $5.0\times10^{16}$ atoms/$cm^3$ or less.

4. The device according to claim 1, further comprising an interconnect layer provided on the ninth semiconductor region with an insulating layer interposed, the interconnect layer being separated from the second electrode, the interconnect layer being electrically connected to the gate electrode.

5. The device according to claim 1, further comprising a tenth semiconductor region provided around the ninth semiconductor region, the tenth semiconductor region being of the second conductivity type, the tenth semiconductor region being separated from the ninth semiconductor region.

6. The device according to claim 1, further comprising a tenth semiconductor region provided around the ninth semiconductor region, the tenth semiconductor region being of the second conductivity type, the tenth semiconductor region contacting the ninth semiconductor region, a lower end of the tenth semiconductor region being positioned higher than a lower end of the ninth semiconductor region.

7. The device according to claim 1, further comprising an eleventh semiconductor region provided between the fifth semiconductor region and each of the first semiconductor region, the second semiconductor region, the plurality of third semiconductor regions, and the plurality of fourth semiconductor regions, the eleventh semiconductor region being of the first conductivity type, an impurity concentration of the first conductivity type in the eleventh semiconductor region being lower than an impurity concentration of the first conductivity type in the first semiconductor region and higher than an impurity concentration of the first conductivity type in the fifth semiconductor region.

8. The device according to claim 1, further comprising a conductive layer opposing, with an insulating layer interposed, the sixth semiconductor region and a portion of the fifth semiconductor region.

* * * * *